United States Patent

Mandai et al.

Patent Number: 5,436,601
Date of Patent: Jul. 25, 1995

[54] LAMINATED DELAY LINE

[75] Inventors: Harufumi Mandai; Noboru Kato; Akihiro Ochii, all of Nagaokakyo, Japan

[73] Assignee: Muraka Manufacturing Co., Ltd., Kyoto, Japan

[21] Appl. No.: 183,285

[22] Filed: Jan. 18, 1994

[30] Foreign Application Priority Data

Jan. 19, 1993 [JP] Japan .................................. 5-024738

[51] Int. Cl.⁶ .............................................. H03H 7/30
[52] U.S. Cl. ...................................... 333/138; 333/140
[58] Field of Search ............................ 333/138–140, 333/156, 161, 185

[56] References Cited

U.S. PATENT DOCUMENTS 4,203,081 5/1980 Braeckelmann ................. 333/140 X
5,187,455 2/1993 Mandai et al. ................... 333/156 X

FOREIGN PATENT DOCUMENTS 2589009 4/1987 France ................................ 333/140

Primary Examiner—Seungsook Ham
Attorney, Agent, or Firm—Ostrolenk, Faber, Gerb & Soffen

[57] ABSTRACT

Earth electrodes are formed on two layers. A capacitor electrode is formed on a layer therebetween. A capacitor is formed by the capacitor electrode and the earth electrodes. Coil electrodes are formed respectively on a plural number of layers. The plural number of coil electrodes are connected through a through hole. An intermediate portion of the connected coil electrodes is connected to the earth electrodes to form a transformer. A delay line is formed by connecting the capacitor electrode and the coil electrodes via external electrodes.

9 Claims, 10 Drawing Sheets

F I G. 10
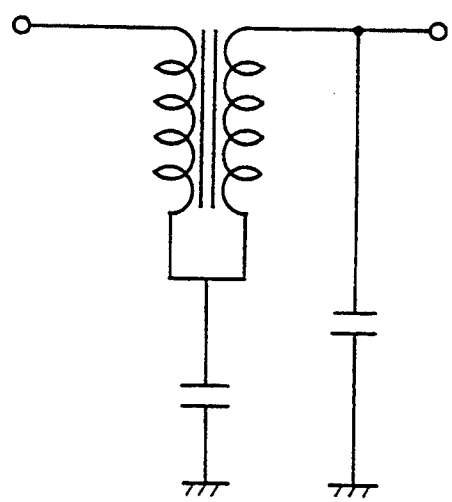

LAMINATED DELAY LINE

BACKGROUND OF THE INVENTION

1. Field of the Invention

The present invention relates to a delay line, and particularly to, for example, a centralized, constant-type delay line.

2. Description of the Prior Art

FIG. 11 is an illustrative view showing an example of a conventional delay line serving as a background of the present invention. The delay line 1 includes a printed board 2. On one surface of the printed board 2, for example, a ferrite inductor 3 is fixed. Moreover, onto the other surface of the printed board 2, a chip capacitor 4 is soldered. The ferrite inductor 3 and the chip capacitor 4 are connected by a pattern electrode formed on the printed board 2. A circuit formed by the ferrite inductor 3 and the chip capacitor 4 is connected to a terminal 5 extending from the printed board 2.

In the delay line 1, as shown in FIG. 12, a plural number of inductances are formed by the ferrite inductor 3, and a plural number of capacitances are formed by the chip capacitor 4. The delay line is formed by these inductances and capacitances.

However, there is about 20% variation in the inductance of the ferrite inductor used in such a delay line, causing variations in a delay time of the delay line. Because the ferrite inductor and the chip capacitor are exposed, the inductance and the capacitance fluctuate by variations of the atmospheric temperature. And hence, temperature characteristics of the delay line also change. Moreover, since such delay lines include terminals, it is difficult to meet a recent, surface mounting demand.

SUMMARY OF THE INVENTION

Therefore, the present invention provides a delay line, in which characteristics variations between respective elements, and temperature characteristic variations, are small, and whereby surface mounting is possible.

The present invention is directed to a delay line comprising a plural number of coil electrodes which are formed on a plural number of layers and are respectively connected to form a transformer, a capacitor electrode and a ground electrode which form a capacitor by clamping a separate layer and opposing one another, and a laminate, formed by laminating the layers whereon the coil electrodes are formed, and the layer clamped by the capacitor electrode and the ground electrode, in the laminate, wherein the transformer and the capacitor formed in the laminate are connected to one another.

The transformer and the capacitor are connected by external electrodes formed on side faces of the laminate.

A separate capacitor, which is connected to the transformer in parallel, may be formed in the laminate.

An inductance and a capacitance are decided by the size and number of electrodes in the laminate. Thus, by deciding the electrode size, substantially fixed inductance and capacitance can be obtained. Since the electrodes are formed inside the laminate, the inductance and capacitance are hardly affected by the atmospheric temperature. The external electrodes on the side faces of the laminate are utilized for connection to external circuits besides connecting the transformer and the capacitor.

According to the present invention, since the variation of the inductance and capacitance are small, the characteristics variations of the delay line can be reduced. Since the inductance and capacitance are hardly affected by the atmospheric temperature, the delay line having a small temperature characteristics variation can be obtained. Since it is connected to the external circuits by the external electrodes on the side faces of the laminate, the surface mounting-type delay line can be obtained.

The above and other objects, features, aspects and advantages of the present invention will become more apparent from the following detailed description of the embodiments made with reference to the drawings.

BRIEF DESCRIPTION OF THE DRAWINGS

FIG. 10 is an equivalent circuit diagram of a delay line shown in FIG. 9.

DESCRIPTION OF THE PREFERRED EMBODIMENTS

Figure 1:
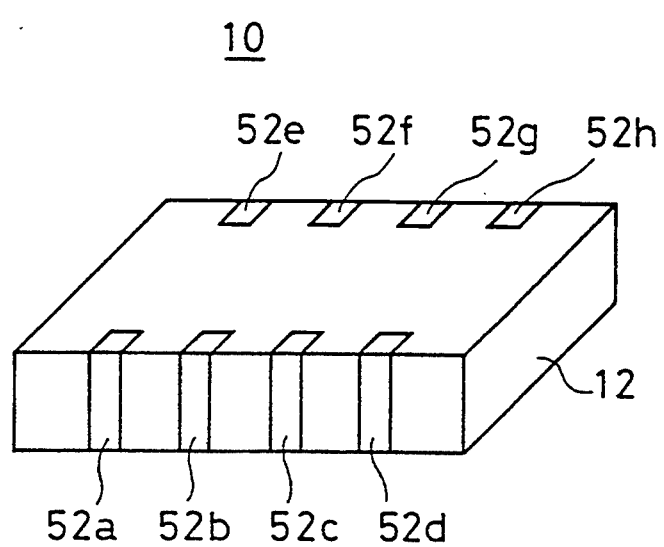
FIG. 1 is a perspective view showing one embodiment of the present invention.
Figure 2:
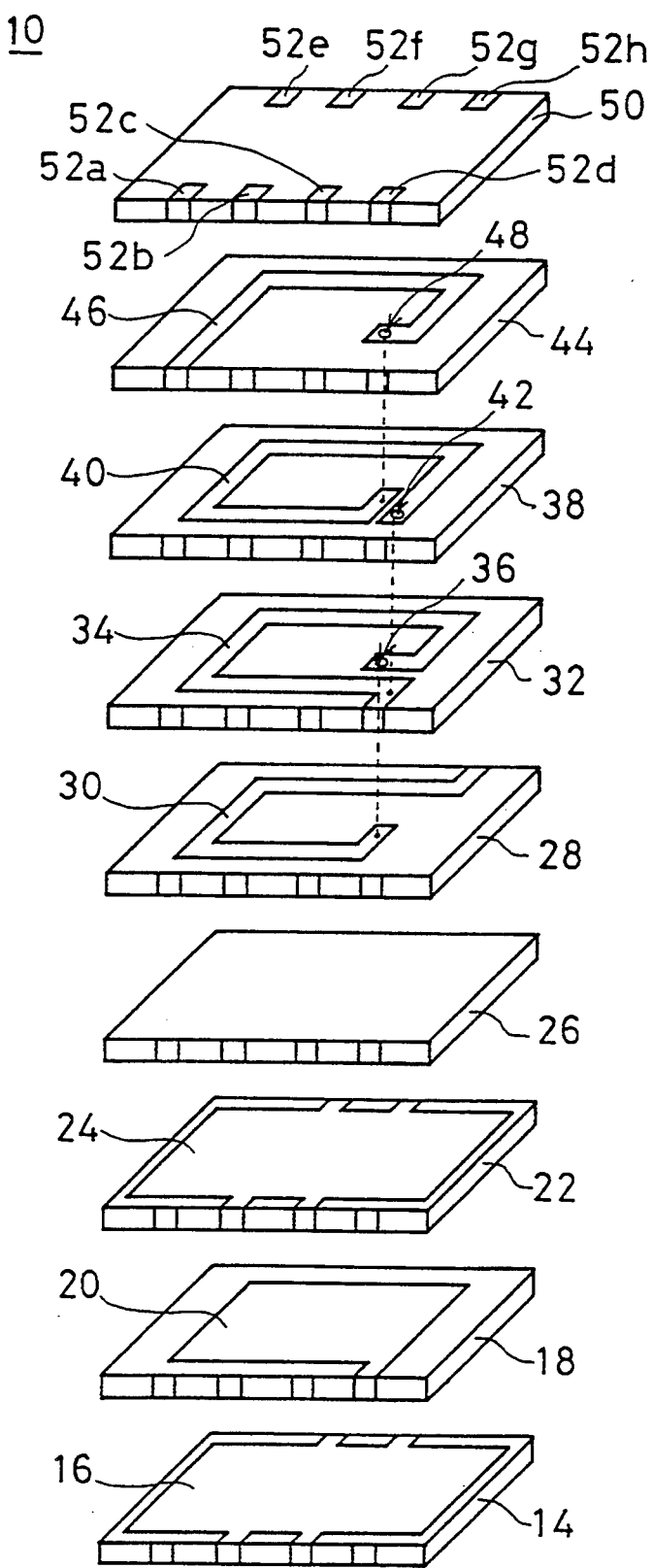
FIG. 2 is an exploded perspective view of a delay line shown in FIG. 1.

FIG. 1 is a perspective view showing one embodiment of the present invention. A delay line 10 comprises a laminate 12. As shown in FIG. 2, the laminate 12 includes a plural number of layers. A first ground electrode 16 is formed on a first layer 14. The first ground electrode 16 is formed substantially throughout the surface of the first layer 14 except its periphery, and is respectively drawn out at two portions on the opposite ends of the first layer 14.

A second layer 18 is formed above the first ground electrode 16. A first capacitor electrode 20 is formed on the second layer 18. The first capacitor electrode 20 is formed so as to oppose the first ground electrode 16. The first capacitor electrode 20 is drawn out at one end of the second layer 18. The first capacitor electrode 20 is drawn out at a position separated from the drawn-out portions of the first electrode 16.

A third layer 22 is formed above the first capacitor electrode 20. A second ground electrode 24 is formed on the third layer 22. The second ground electrode 24 is formed into a same shape as the first earth electrode 16. A capacitor is formed by the first capacitor electrode 20 and the two ground electrodes 16, 24. Above the second ground electrode 24, a fourth layer 26 is formed.

A fifth layer 28 is formed above the fourth layer 26. A first coil electrode 30 is formed on the fifth layer 28. The first coil electrode 30 is formed to make about a ¾ round from the other end side of the fifth layer 28. The first coil electrode 30 is drawn out at a position different from the draw-out positions of the ground electrodes 16, 24.

Above the first coil electrode 30, a sixth layer 32 is formed. A second coil electrode 34 is formed on the sixth layer 32. The second coil electrode 34 makes a round from a position corresponding to the end portion of the first coil electrode 30, and is drawn out at one end side of the sixth layer 32. The second coil electrode 34 is drawn out at a position corresponding to the draw-out position of the first capacitor electrode 20. A through-hole 36 is formed in the end portion of the second coil electrode 34, through which the first coil electrode 30 and the second coil electrode are connected.

Above the second coil electrode 34, a seventh layer 38 is formed. A third coil electrode 40 is formed on the seventh layer 38. The third coil electrode 40 is formed to make a round from a position corresponding to the draw-out position of the second coil electrode 34. A through-hole 42 is formed in one end of the third coil electrode 40, through which the second coil electrode 34 and the third coil electrode 40 are connected.

Above the third coil electrode 40, an eighth layer 44 is formed. A fourth coil electrode 46 is formed on the eighth layer 44. The fourth coil electrode 46 makes about a ¾ round from a position corresponding to the other end of the third coil electrode 40, and is drawn out at one end side of the eighth layer 44. A through-hole 48 is formed in an end portion of the fourth coil electrode 46, through which the third coil electrode 40 and the fourth coil electrode 46 are connected. Above the fourth coil electrode 46, a ninth layer 50 is formed. These layers are laminated to form a laminate 12.

On side faces of the laminate 12, a plural number of external electrodes 52a, 52b, 52c, 52d, 52e, 52f, 52g and 52h are formed. The fourth coil electrode 46 is connected to the external electrode 52a. The ground electrodes 16 and 24 are connected to the external electrodes 52b, 52c, 52f and 52g. The first capacitor electrode 20 and the second coil electrode 34 are connected to the external electrode 52d, and the first coil electrode 30 is connected to the external electrode 52h.

Figure 3:
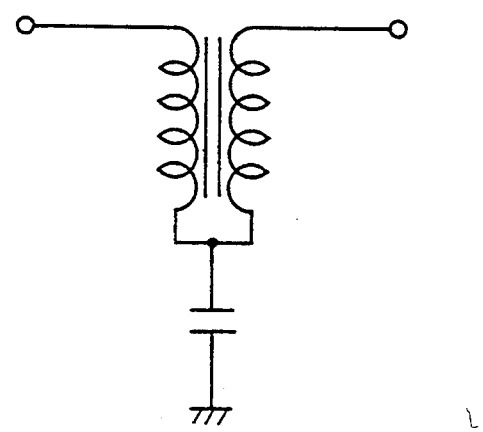
FIG. 3 is an equivalent circuit diagram of a delay line shown in FIG. 1 and FIG. 2.

The delay line 10 includes an equivalent circuit as shown in FIG. 3. In the delay line 10, an inductance is formed by the four coil electrodes 30, 34, 40 and 46. An intermediate portion of the inductance is connected to the first capacitor electrode 20, which forms a capacitor with the ground electrodes 16 and 24. Thus, as shown in FIG. 3, the inductance portion serves as a transformer, which is grounded via the capacitor.

To manufacture such delay line 10, for example, an electrode paste is applied on ceramic green sheets in a shape of the electrodes to form the laminate 12 by laminating and sintering. Meanwhile, the external electrodes are formed by applying and baking the electrode paste for external electrodes on side faces of the laminate 12.

In the delay line 10, the inductance is decided by the size and number of turns of the coil electrodes 30, 34, 40 and 46, and the capacitance is decided by the size of the first capacitor electrode 20 and the ground electrodes 16, 24. Thus, when the size is fixed at the time of applying the electrode paste, substantially fixed characteristics can be obtained. Thus, even when a large number of delay lines are manufactured, characteristics variations therebetween can be reduced.

Since the coil electrodes 30, 34, 40, 46, the capacitor electrode 20 and the earth electrodes 16, 24 are formed inside the laminate 12, they are hardly affected by the change of atmospheric temperature. Thus, the temperature characteristic variation of the delay line 10 can be reduced. Since the delay line 10 is in a form of chip having the external electrodes 52a–52h which are formed on the side faces of the laminate 12, it can be surface-mounted on a printed board and the like. Since the inductance and capacitance can be formed in one laminate 12, size can be minimized as compared with the conventional delay line.

Figure 4:
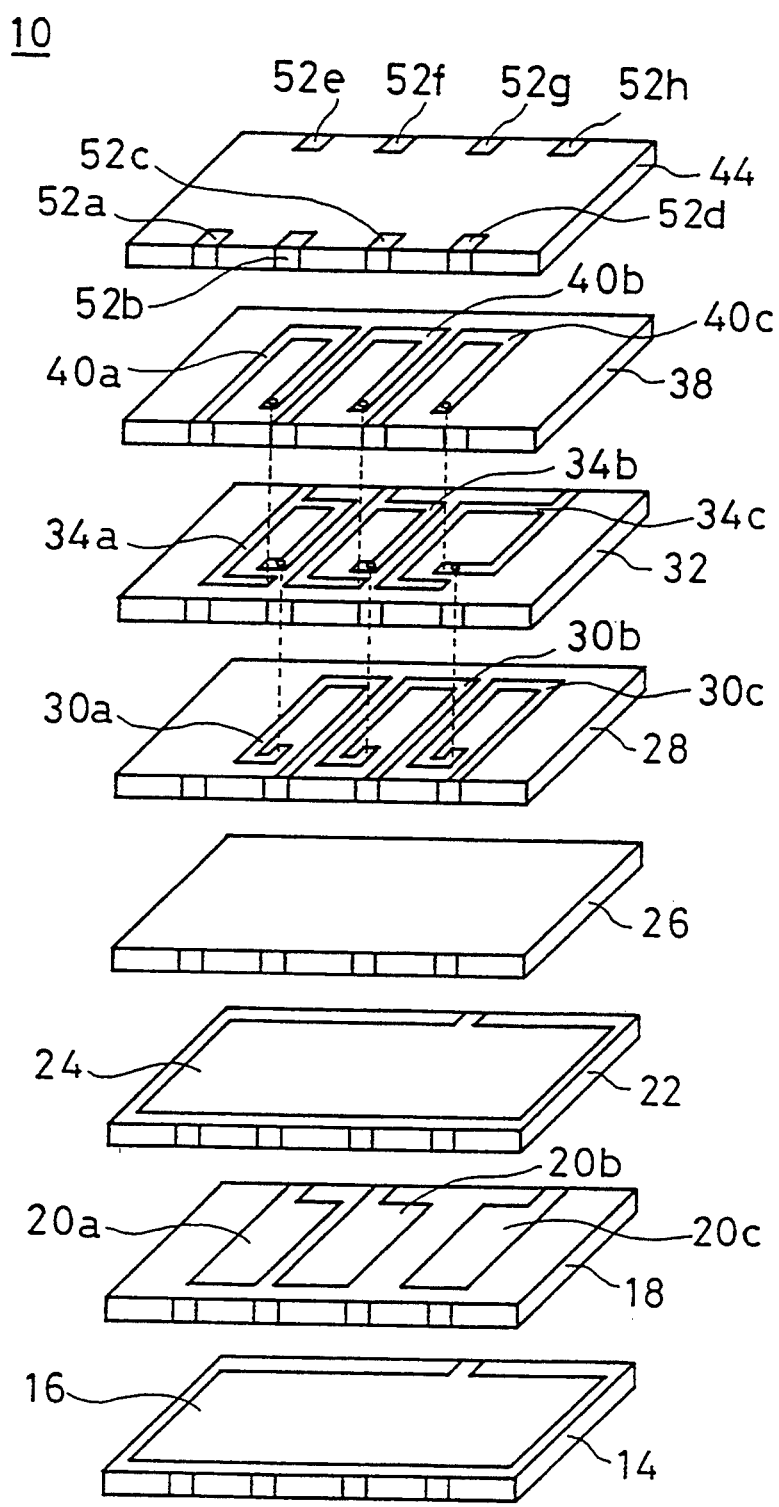
FIG. 4 is an exploded perspective view showing another embodiment of the present invention.

As shown in FIG. 4, a plural number of transformers and capacitors can be formed in the laminate 12. In the delay line 10, three capacitor electrodes 20a, 20b and 20c are formed on the second layer 18. Three first coil electrodes 30a, 30b and 30c are formed on the fifth layer 28, three second coil electrodes 34a, 34b and 34c are formed on the sixth layer 32, and three third coil electrodes 40a, 40b, 40c are formed on the seventh layer 38. In this embodiment, the transformers are formed by the coil electrodes formed on the three layers 28, 32 and 38.

In the delay line 10, the third coil electrode 40a is connected to the external electrode 52a. The first coil electrode 30a and the third coil electrode 40b are connected to the external electrode 52b. The first coil electrode 30b and the third coil electrode 40c are connected to the external electrode 52c. The first coil electrode 30c is connected to the external electrode 52d. The first capacitor electrodes 20a, 20b, 20c and the second coil electrodes 34a, 34b, 34c are connected to the external electrodes 52e, 52f, 52h, and the earth electrodes 16, 24 are connected to the external electrode 52g.

Figure 5:
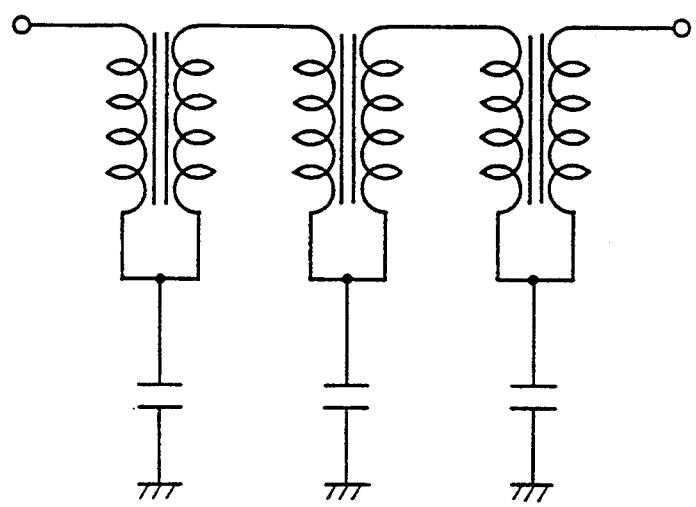
FIG. 5 is an equivalent circuit diagram of a delay line showing in FIG. 4.

Thus, as shown in FIG. 5, the delay line 10 includes an equivalent circuit, in which three transformers are connected in series and the capacitors are connected to the respective transformers. As such, a desired delay time can be obtained by changing the number of transformers and capacitors.

Figure 6:
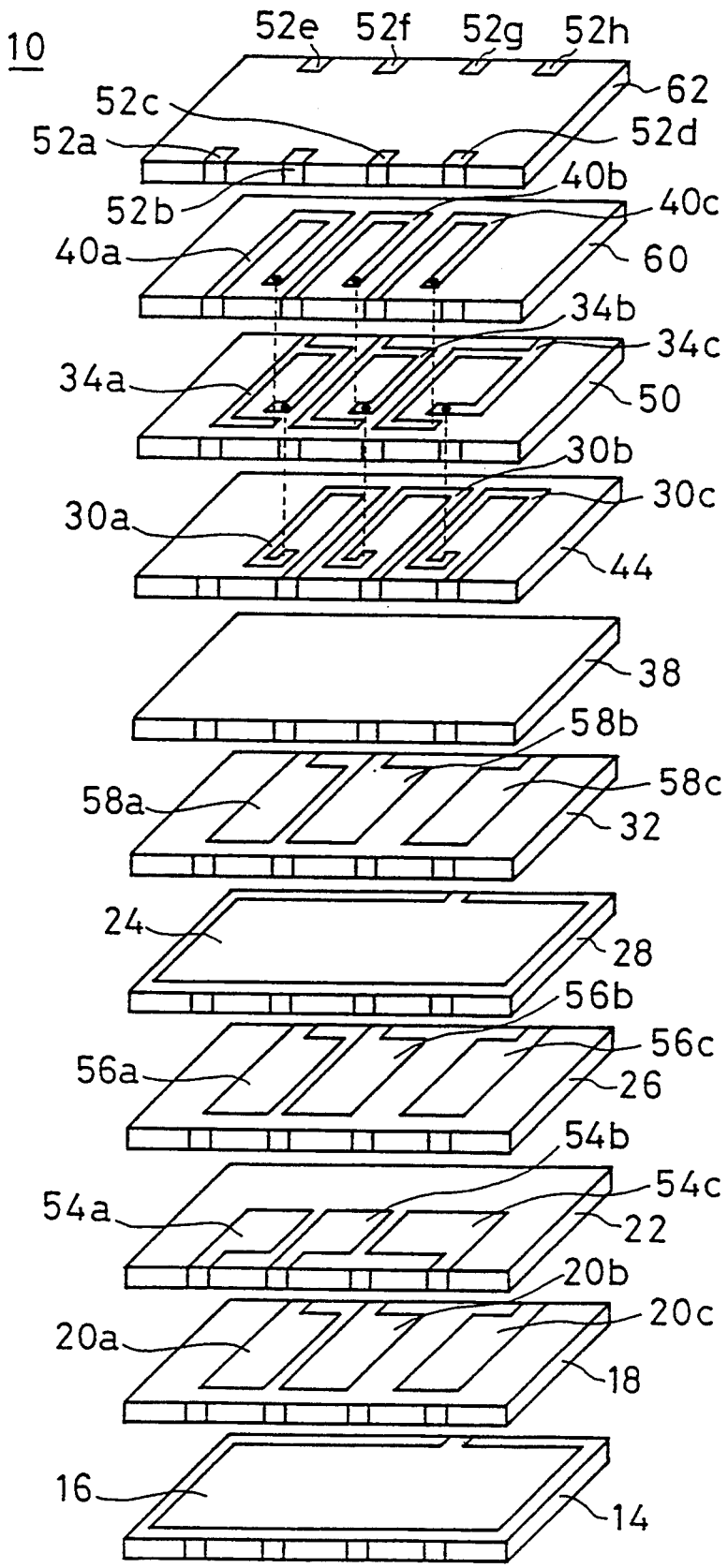
FIG. 6 is an exploded perspective view of a further embodiment of the present invention.

As shown in FIG. 6, the earth electrodes 16, 24 are formed respectively on the first layer 14 and the fifth layer 28. On the second layer 18, the first capacitor electrodes 20a, 20b and 20c are formed. The second capacitor electrodes 54a, 54b and 54c are formed on the third layer 22 so as to oppose to the first capacitor electrodes 20a, 20b and 20c. The second capacitor electrodes 54a, 54b and 54c are respectively connected to the external electrodes 52a, 52b and 52d. Thus, the second capacitor electrode 54a is connected to the third coil electrode 40a, the second capacitor electrode 54b is connected to the first coil electrode 30a and third coil electrode 40b, and the second capacitor electrode 54c is connected to the first coil electrode 30c.

On the fourth layer 26 and the sixth layer 32, the third capacitor electrodes 56a, 56b, 56c and the fourth capacitor electrodes 58a, 58b, 58c are formed respectively. The third capacitor electrodes 56a–56c and the fourth capacitor electrodes 58a–58c are formed into a same shape as the first capacitor electrodes 20a–20c. The first coil electrodes 30a–30c are formed on the eighth layer 44, the second coil electrodes 34a–34c are formed on the ninth layer 50 and the third coil electrodes 40a–40c are formed on a tenth layer 60. Above the third coil electrodes 40a–40c, an eleventh layer 62 is formed.

Figure 7:
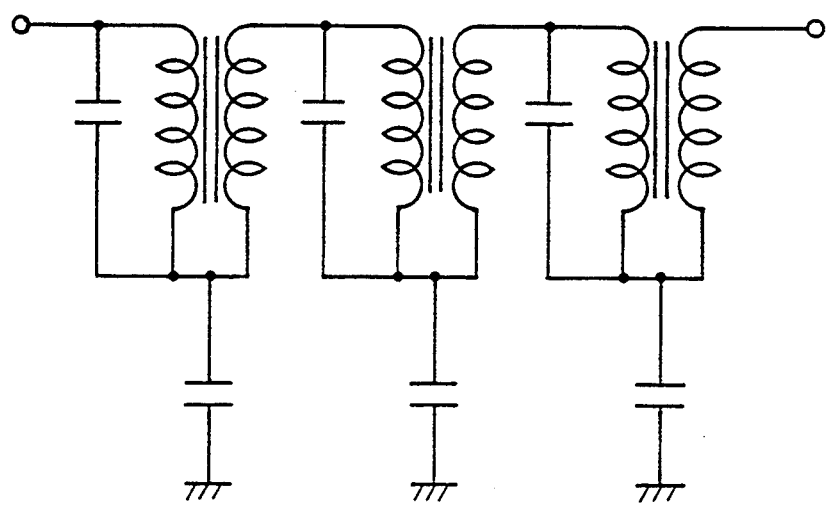
FIG. 7 is an equivalent circuit diagram of a delay line shown in FIG. 6.
Figure 8:
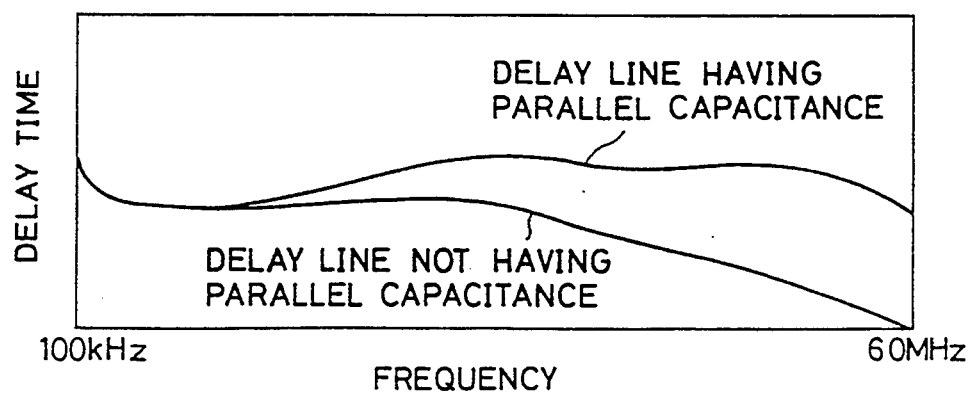
FIG. 8 is a graph showing frequency characteristics of a delay line shown in FIG. 6.

In the delay line 10, capacitances are formed between the second capacitor electrodes 54a–54c and the first capacitor electrodes 20a–20c, and between the second capacitor electrodes 54a–54c and the third capacitor electrodes 56a–56c. Thus, as shown in FIG. 7, the delay line 10 includes an equivalent circuit, in which capacitances are formed in parallel to the transformers. In such delay line 10, as shown in FIG. 8, the frequency characteristics can be improved. As it is understood from FIG. 8, when the capacitance is not formed in parallel to the transformer, the delay time descends on the high frequency side. However, by forming the capacitance in parallel to the transformer, the delay time does not descend on the high frequency side and the stable frequency characteristics can be obtained.

Figure 9:
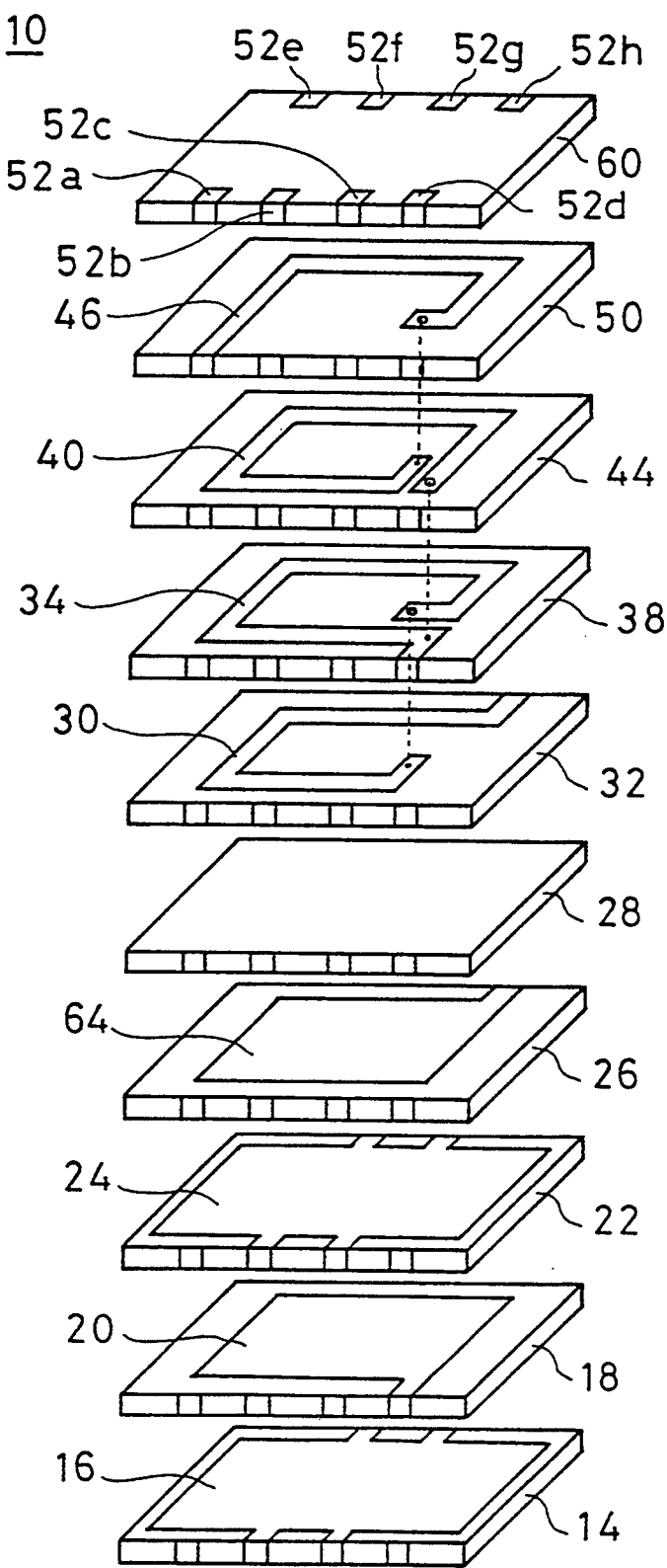
FIG. 9 is an exploded perspective view showing a separate embodiment of the present invention.
Figure 11:
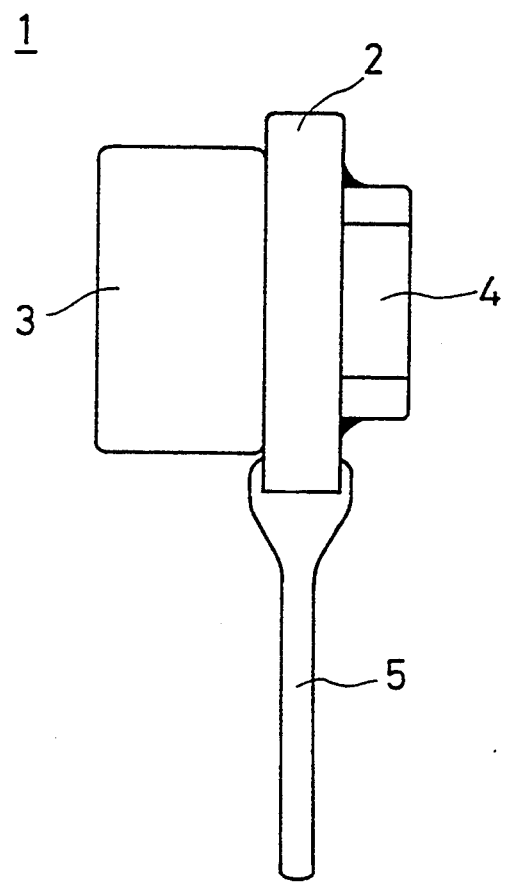
FIG. 11 is an illustrative view showing an example of a conventional delay line serving as a background of the present invention.
Figure 12:
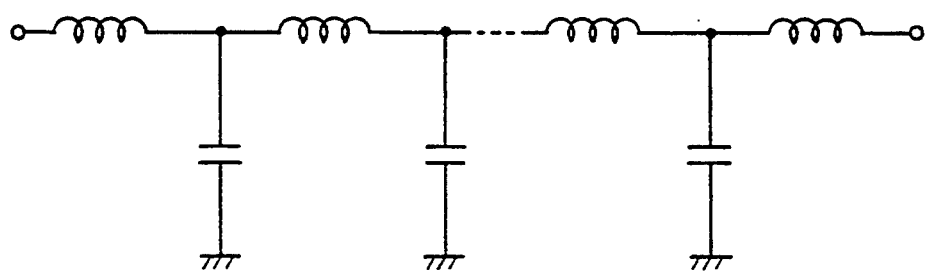
FIG. 12 is an equivalent circuit diagram of a conventional delay line shown in FIG. 11.

The characteristics may be formed between the transformer and the earth by the construction as shown in FIG. 9. In the delay line 10, a fifth capacitor electrode 64 is formed on the fourth layer 26. The fifth capacitor electrode 64 is connected to the first coil electrode 30 via the external electrode 52h. In the delay line 10, a capacitor is formed by the second ground electrode 24 and the fifth capacitor electrode 64. Thus, as shown in FIG. 10, a capacitance is formed between the transformer and ground. In the delay line 10, the capacitance is formed between the transformer and ground to form a low-pass filter for cutting high frequency components. By such low-pass filter, the ringing can be suppressed.

As such, when the delay line is manufactured by forming the electrodes in the laminate, the inductance and capacitance can be decided by the size and number of the internal electrodes, and the variations can be reduced as compared with the case where individual parts are used. Thus, the delay line having a small time variation can be obtained. Also, values of the inductance and capacitance are hardly affected by the change in atmospheric temperature, thus the delay line having a small temperature characteristic variation can be obtained. Moreover, the small-sized delay line in which the external electrodes are formed on the side faces of the laminate, and whereby the surface mounting is possible can be obtained. By forming the capacitance in parallel to the transformer, characteristics of the delay line can be improved.

While the present invention has been particularly described and shown, it is to be understood that such description is used merely as an illustration and example rather than limitation, and the spirit and scope of the present invention is determined solely by the terms of the appended claims.

What is claimed is:

1. A delay line, comprising:
   a transformer formed of two coils connected at an intermediate point, each coil comprising a plurality of coil electrodes connected in series, the transformer having a plurality of layers, each layer having one of the plurality of coil electrodes formed thereon;
   a capacitor connected between the intermediate point of the two coils and ground, the capacitor comprising a capacitor electrode connected to the intermediate point of the coils, a ground electrode spaced from the capacitor electrode, and a dielectric layer disposed between the capacitor electrode and the ground electrode; and
   a separate capacitor connected in parallel to one of the coils, the separate capacitor comprising two separate capacitor electrodes spaced from each other and a dielectric layer disposed between the two separate capacitor electrodes.

2. A delay line in accordance with claim 1, further comprising external electrodes connecting the coil electrodes and the capacitor electrode, and connecting the coil electrodes and the separate capacitor electrodes.

3. A delay line in accordance with claim 1, wherein a plural number of the transformers, the capacitors and the separate capacitors, are connected in series.

4. A delay line, comprising:
   a transformer formed of two coils connected at an intermediate point, each coil comprising a plurality of coil electrodes connected in series, the transformer having plural layers each having one of the plurality of coil electrodes formed thereon;
   a capacitor connected between the intermediate point of the two coils and ground, the capacitor comprising a capacitor electrode connected to the intermediate point of the coil electrodes, a ground electrode spaced from the capacitor electrode, and a dielectric layer disposed between the capacitor electrode and the ground electrode; and
   a separate capacitor, connected between one end of the two coils and ground, the separate capacitor comprising a separate capacitor electrode connected to the one end of the two coils, a separate ground electrode connected to ground and spaced from the separate capacitor electrode, and a dielectric layer disposed between the separate capacitor electrode and the separate ground electrode.

5. A delay line in accordance with claim 4, further comprising external electrodes for connecting the coil electrodes and the capacitor electrode, and connecting the coil electrodes and the separate capacitor electrode.

6. A delay line in accordance with claim 4, wherein a plural number of the transformers, the capacitors and the separate capacitors, are connected in series.

7. A delay line, comprising:
   a transformer formed of two coils which are connected at an intermediate point, each coil comprising a plurality of coil electrodes connected in series, the transformer having a plurality of layers, each layer having one of the plurality of coil electrodes formed thereon;
   a capacitor connected between the intermediate point of the two coils and ground, the capacitor comprising a capacitor electrode connected to the intermediate point of the coils, a ground electrode spaced from the capacitor electrode, and a dielectric layer disposed between the capacitor electrode and the ground electrode;
   a separate capacitor connected between one end of the two coils and ground, the separate capacitor comprising a separate capacitor electrode connected to the one end of the two coils, the separate capacitor electrode being spaced from the ground electrode, and a dielectric layer disposed between the separate capacitor electrode and the ground electrode.

8. A delay line in accordance with claim 7, further comprising external electrodes for connecting the coil electrodes and the capacitor electrode, and connecting the coil electrodes and the separate capacitor electrode.

9. A delay line in accordance with claim 8, wherein a plural number of the transformers, the capacitors and the separate capacitors, are connected in series.

* * * * *